(12) United States Patent
Saito

(10) Patent No.: US 7,604,331 B2
(45) Date of Patent: Oct. 20, 2009

(54) PIEZOELECTRIC ELEMENT, METHOD OF MANUFACTURING THE PIEZOELECTRIC ELEMENT, AND LIQUID EJECTING HEAD

(75) Inventor: Takeshi Saito, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 294 days.

(21) Appl. No.: 11/846,454

(22) Filed: Aug. 28, 2007

(65) Prior Publication Data

US 2008/0055369 A1 Mar. 6, 2008

(30) Foreign Application Priority Data

Aug. 30, 2006 (JP) ............................. 2006-234078

(51) Int. Cl.
*B41J 2/045* (2006.01)
(52) U.S. Cl. .............................. 347/71; 347/68; 347/70; 347/72
(58) Field of Classification Search .................. 347/71, 347/68–70, 72, 124.16, 124.17; 29/25.35; 310/363–366, 324, 328
See application file for complete search history.

(56) References Cited

U.S. PATENT DOCUMENTS 7,479,728 B2 * 1/2009 Murai et al. ................. 310/363
2004/0104981 A1 * 6/2004 Fujii et al. ..................... 347/71

FOREIGN PATENT DOCUMENTS

| JP | 11-205898 | 7/1999 |
| JP | 2001-274472 | 10/2001 |
| JP | 2005-203477 | 7/2005 |
| WO | 99/45598 | 9/1999 |

* cited by examiner

*Primary Examiner*—K. Feggins
(74) *Attorney, Agent, or Firm*—Workman Nydegger

(57) ABSTRACT

A piezoelectric element includes a lower electrode film formed on one surface of a substrate, a piezoelectric layer made of a piezoelectric material and disposed on the lower electrode film, and an upper electrode film disposed on the piezoelectric layer, in which the lower electrode film contains platinum, titanium, iridium, and oxygen, and the lower electrode film includes a first layer disposed on the substrate and containing platinum as a primary component, a second layer disposed on the first layer and containing titanium as a primary component, and a third layer disposed on the second layer and containing iridium as a primary component.

5 Claims, 9 Drawing Sheets

PIEZOELECTRIC ELEMENT, METHOD OF MANUFACTURING THE PIEZOELECTRIC ELEMENT, AND LIQUID EJECTING HEAD

The entire disclosure of Japanese Application No. 2006-234078, filed Aug. 30, 2006 is expressly incorporated by reference herein.

BACKGROUND

1. Technical Field

The present invention relates to a piezoelectric element composed of a lower electrode film, a piezoelectric layer, and an upper electrode film and a method of manufacturing the piezoelectric element, and more particularly to a piezoelectric element for use in a liquid ejecting head which ejects liquid droplets from its nozzle orifices.

2. Related Art

A piezoelectric element for use in liquid ejecting heads has a structure in which a piezoelectric film made of a piezoelectric material having an electromechanical transduction function is interposed between two electrodes. The piezoelectric film is made of, for example, crystallized piezoelectric ceramic.

An example of liquid ejecting heads using such piezoelectric elements is an ink jet recording head structured in a manner such that part of a pressure generating chamber communicating with a nozzle orifice from which ink droplets are ejected is constituted by a vibrating plate and a piezoelectric element deforms the vibrating plate so as to apply a pressure to ink in the pressure generating chamber, so that ink droplets are ejected from the nozzle orifice. There are two types of commercialized ink jet recording head. One type uses a longitudinal oscillation mode actuator in which a piezoelectric element expands and contracts in an axial direction and the other type uses a flexural oscillation mode actuator. As for the ink jet recording head using the flexural oscillation mode actuator, there is a known technique in which a piezoelectric layer having a uniform thickness is formed over the entire surface of a vibrating plate by a film forming technique and then it is divided into a plurality of piezoelectric units, each having a shape corresponding to that of a pressure generating chamber, by a lithography process. In this technique, piezoelectric elements are disposed so as to correspond to the pressure generating chambers and isolated from each other.

JP-A-2001-274472 discloses a technique in which a piezoelectric layer (piezoelectric thin film) is made of, for example, a ferroelectric substance, such as lead zirconate titanate (PZT). Further, the piezoelectric thin film is prepared by forming titanium crystals on a lower electrode film by a sputtering method and then forming a piezoelectric precursor film on the titanium crystals by a sol-gel method or a metal-organic decomposition (MOD) method (MOD) and calcining the piezoelectric precursor film. Upon calcining the piezoelectric precursor film, the lower electrode film is also heated. However, the above-mentioned document does not disclose details of the lower electrode film nor mention adhesion either between the obtained lower electrode film and the substrate or between the lower electrode film and the piezoelectric layer at all.

SUMMARY

An advantage of some aspects of the invention is that it provides a piezoelectric element having excellent adhesion both between a lower electrode film and a substrate and between the lower electrode film and a piezoelectric layer, excellent displacement characteristic, and enhanced long-term reliability, a method of manufacturing the piezoelectric element, and a liquid ejecting head.

A first aspect of the invention provides a piezoelectric element including a lower electrode film disposed on one surface of a substrate, a piezoelectric layer made of a piezoelectric material and disposed on the lower electrode film, and an upper electrode film disposed on the piezoelectric layer, in which the lower electrode film contains platinum, titanium, iridium, and oxygen and includes a first layer containing platinum as a primary component, a second layer containing titanium as a primary component, and a third layer containing iridium as a primary component.

According to the first aspect, it is possible to provide the piezoelectric element having excellent adhesion both between the lower electrode film and the substrate and between the lower electrode film and the piezoelectric layer thanks to a predetermined designed of the lower electrode film and having excellent displace characteristic and enhanced long-term reliability thanks to enhanced toughness.

In the piezoelectric element, it is preferable that the first layer contains titanium as a secondary component, the second layer contains platinum as a secondary component, and the third layer contains titanium as a secondary component.

With this structure, it is possible to provide the piezoelectric element having excellent adhesion both between the lower electrode film and the substrate and between the lower electrode film and the piezoelectric layer thanks to a predetermined structure of the lower electrode film and having excellent displace characteristic and enhanced long-term reliability thanks to enhanced toughness.

In the piezoelectric element, it is preferable that a thicknesses ratio of the first layer, the second layer, and the third layer is 6 to 7:3 to 2:1.

With this structure, it is possible to provide the piezoelectric element having excellent adhesion both between the lower electrode film and the substrate and between the lower electrode film and the piezoelectric layer thanks to a predetermined structure of the lower electrode film and having excellent displace characteristic and enhanced long-term reliability thanks to enhanced toughness.

A second aspect of the invention provides a liquid ejecting head including the piezoelectric element according to the first aspect and a fluid channel forming substrate, on one side of which the piezoelectric element is disposed with a vibrating plate interposed between the piezoelectric element and the fluid channel forming substrate and which has a pressure generating chamber communicating with a nozzle orifice from which liquid droplets are ejected.

According to the second aspect, it is possible to provide a liquid ejecting head having excellent durability and enhanced reliability because adhesion both between the lower electrode film and the substrate and between the lower electrode film and the piezoelectric layer is excellent thanks to a predetermined design of the lower electrode film, and displace characteristic and enhanced long-term reliability are improved thanks to the enhanced toughness.

A third aspect of the invention provides a method of manufacturing a piezoelectric element. According to this aspect, the manufacturing method includes a lower electrode film formation process in which a lower electrode film is formed by sequentially forming an adhesion layer made of titanium, a platinum layer made of platinum, and a diffusion barrier layer made of iridium with a thickness ratio of 1:4 to 6:0.5 to 1 on one surface of a substrate. The manufacturing method further includes a piezoelectric layer forming process in which a piezoelectric layer composed of a crystallized piezoelectric film is formed by forming a piezoelectric substance precursor film made of a piezoelectric material on the lower electrode film while calcining the piezoelectric substance precursor film so as to be crystallized. The manufacturing method still further includes an upper electrode formation process in which an upper electrode film is formed on the piezoelectric layer.

According to this aspect, it is possible to form the lower electrode film having a desired structure, and thus it is possible to provide a piezoelectric element having excellent adhesion both between the lower electrode film and the substrate and between the lower electrode film and the piezoelectric layer. Moreover, it is possible to provide the piezoelectric element having excellent displacement characteristic and enhanced long-term reliability thanks to enhanced toughness.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a first embodiment of the invention will be described in detail.

First Embodiment

Figure 1:
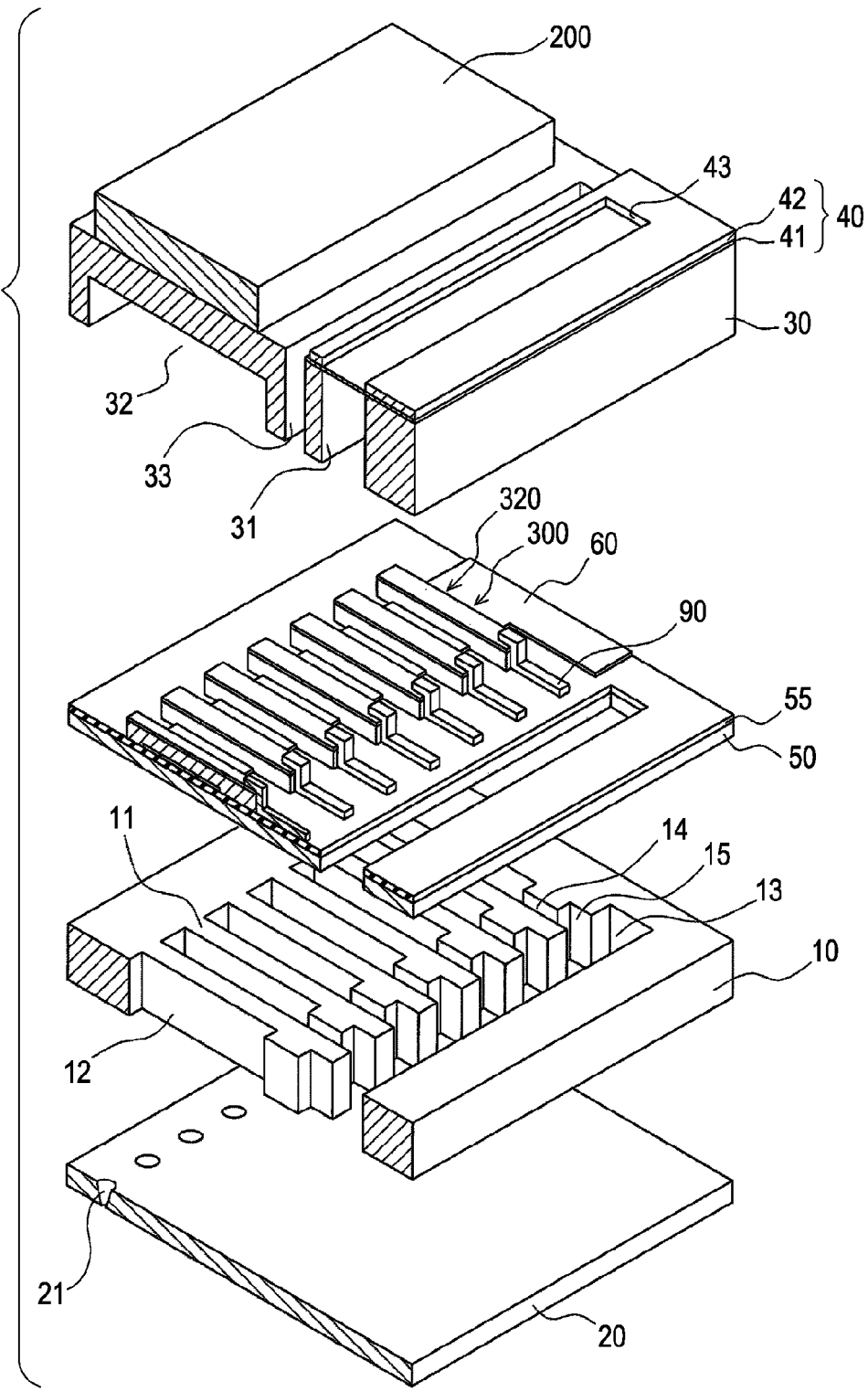
FIG. 1 is an exploded perspective view illustrating a schematic structure of a recording head according to a first embodiment.
Figure 2A:
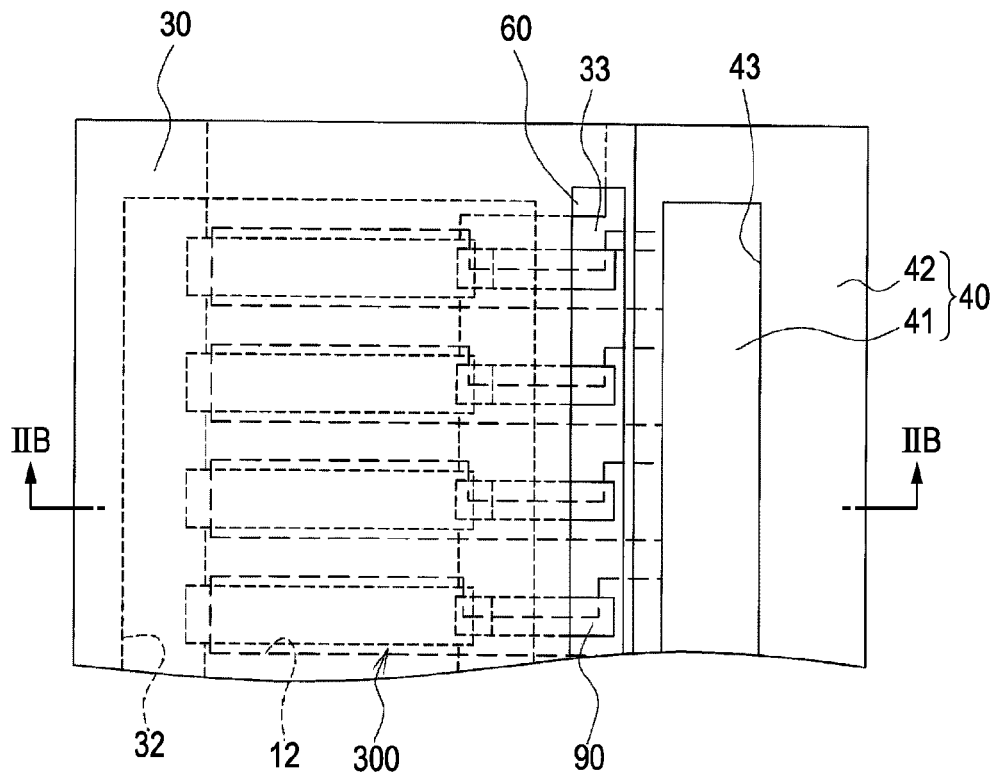
FIG. 2A is a plan view illustrating the recording head according to the first embodiment.
Figure 2B:
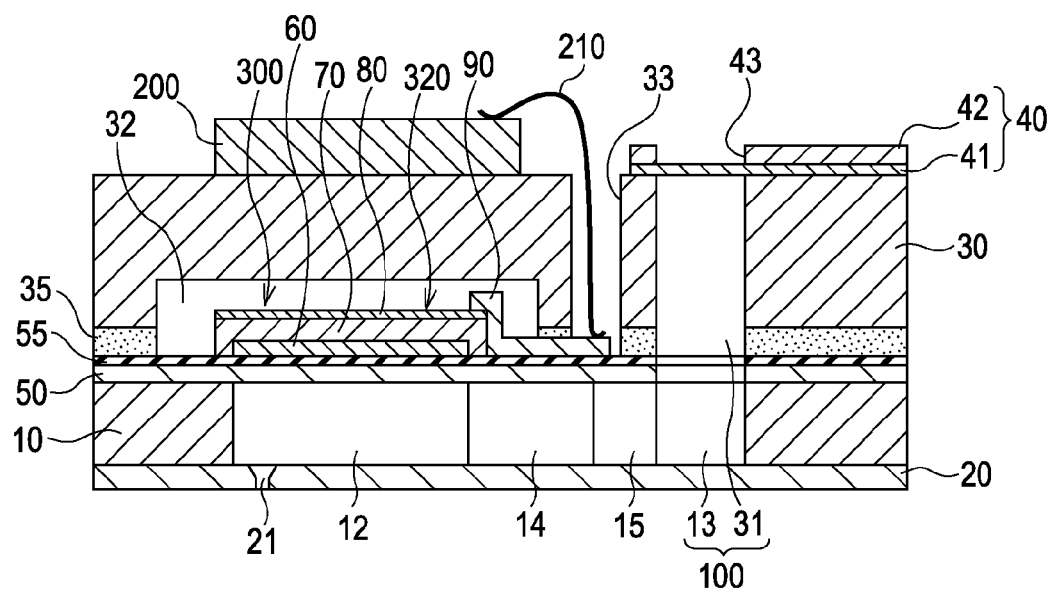
FIG. 2B is a sectional view illustrating the recording head according to the first embodiment.

FIG. 1 schematically shows the structure of an ink jet recording head which is an example of a liquid ejecting head according to the first embodiment in an exploded perspective view. FIGS. 2A and 2B show the ink jet recording head according to the first embodiment in a plan view and a sectional view which is taken along line IIB-IIB' shown in FIG. 2A.

As shown in FIGS. 1, 2A, and 2B, in this embodiment, a single crystal silicon substrate having a surface with a [110] crystal lattice orientation is used as a fluid channel forming substrate 10. An elastic film 50 made of silicon dioxide is formed on one surface of the single crystal silicon substrate to a thickness in the range from 0.5 to 2 μm by a thermal oxidation process.

The fluid channel forming substrate 10 is provided with a plurality of pressure generating chambers 12 arranged in parallel to each other along the widthwise direction (short-side direction). The pressure generating chambers 12 are defined by a plurality of barriers 11 and formed by etching the single crystal silicon substrate from the other surface thereof by an unisotropic etching method. Further, an ink supply channel 14 and a communication channel 15 defined by the barriers 11 are disposed at one end, in the lengthwise direction (long-side direction), of each of the pressure generating chambers 12. A communication portion 13 constituting part of a reservoir 100 which is a shared ink chamber (liquid chamber) shared by the pressure generating chambers 12 is formed at one end of the communication channels 15. That is, a fluid passage composed of the pressure generating chambers 12, the communication portion 13, the ink supply channels 14, and the communication channels 15 is disposed in the fluid channel forming substrate 10.

Each of the ink supply channels 14 communicates with an end, in the lengthwise direction, of the corresponding pressure channel chamber 12 at a first end thereof and has a section area smaller than that of the pressure generating chamber 12. For example, according to this embodiment, each ink supply channel 14 is an element for constricting the fluid passage disposed between the reservoir 100 and the corresponding pressure generating chamber 12 in the widthwise direction, at a position near the pressure generating chamber 12. Accordingly, each ink supply channel 14 has a smaller width than the corresponding pressure generating chamber 12. According to this embodiment, the ink supply channel 14 is structured so as to constrict the width of the fluid channel from one side of the fluid channel. However, alternatively, the ink supply channel 14 may be structured so as to constrict the width of the fluid channel from both sides of the fluid channel. In addition, the ink supply channel 14 may be structured so as to constrict the size of the fluid channel in the thickness direction. Each communication channel 15 communicates with a second end of the corresponding ink supply channel 14, which is the end farther from the pressure generating chamber 12 than the first end, and has a section area larger than that of the ink supply channel 14 when measured in the widthwise (short-side) direction. According to this embodiment, section area of the communication channel 15 is equal to that of the pressure generating chamber 12.

That is, the fluid channel forming substrate 10 has the pressure generating chambers 12, the ink supply channels 14 having a section area smaller than that (in the widthwise direction) of the pressure generating chamber 12, and the communication channels 15 defined by the barriers 11, communicating with the ink supply channels 14 and having a section area larger than that (in the widthwise direction) of the ink supply channel 14.

A nozzle plate 20 having nozzle orifices 21 each communicating with a first end of the corresponding pressure generating chamber 12, which is farther from the ink supply channel 14 than a second end, is fixed to a first surface of the fluid channel forming substrate 10 by an adhesive or a heat-melting film, the first surface being a surface on which openings are provided. The nozzle plate 20 is formed of, for example, a glass ceramic substrate, a single crystal silicon substrate, a stainless steel substrate, or the like.

The elastic film 50 having a thickness of about 1.0 μm and made of silicon dioxide is formed on a second surface of the fluid channel forming substrate 10 which is opposite the first surface. An insulation film 55 having a thickness of about 0.4 µm and made of zirconium oxide ($ZrO_2$) is formed on the elastic film 50. A lower electrode film 60 having a thickness of 0.1 to 0.5 µm, a piezoelectric layer 70 having a thickness of about 1.1 µm and made of lead zirconate titanate (PZT) which is a dielectric film, and an upper electrode film 80 having a thickness of about 0.05 µm and made of gold, platinum, iridium, or the like are stacked on the insulation film 55 through the following processes, so as to constitute a piezoelectric element 300.

The piezoelectric element 300 refers a portion including the lower electrode film 60, the piezoelectric layer 70, and the upper electrode film 80. Generally, any one of the electrodes of the piezoelectric element 300 is a common electrode shared by a plurality of piezoelectric elements 300. However, the other electrode is an individual electrode. Accordingly, the other electrode and the piezoelectric layer 70 are patterned into a plurality of individual electrodes and piezoelectric units which are correspondingly disposed to the pressure generating chambers 12. Here, a portion which is composed of the patterned electrode and piezoelectric layer 70 and in which piezoelectric strain occurs when a voltage is applied to both electrodes is referred to as a piezoelectric active portion 320. According to this embodiment, the lower electrode film 60 is used as the common electrode, and the upper electrode film 80 is used as individual electrodes of the piezoelectric elements 300. However, this scheme may be reversed according to circumstances, such as a driver circuit and a wiring structure. In any case, piezoelectric active portions 320 are disposed in correspondence with the pressure generating chambers 12. Here, each piezoelectric element 300 and the corresponding vibrating plate displaced when the piezoelectric element 300 is driven constitute an actuator. In this embodiment, the elastic film 50, the insulation film 55, and the lower electrode film 60 constitute the vibrating plate. Alternatively, the vibrating plate may be constituted only by the lower electrode film 60, lacking the elastic film 50 and the insulation film 55.

The lower electrode film 60 in this embodiment contains platinum Pt, titanium Ti, iridium, Ir and oxygen O, and is composed of a first layer containing platinum Pt a primary component, a second layer containing titanium Ti as a primary component, and a third layer containing iridium Ir as a primary component which are sequentially stacked. The phrase "contains platinum Pt, titanium Ti, iridium Ir and oxygen O" means that the components including platinum Pt, titanium Ti, iridium Ir, and oxygen O are contained in the corresponding layers in any forms, such as a metal element, an alloy, a metal compound, a metal oxide, or other chemically available forms after the elements are diffused to each other. Each layer mentioned above contains the corresponding component mentioned above.

The piezoelectric layer 70 is a crystalline film having a perovoskite structure, made of a ferroelectric ceramic material having the electromechanical transduction function and formed on the lower electrode film 60. A preferable material for the piezoelectric layer 70 is a ferroelectric piezoelectric material, such as lead zirconate titanate (PZT), and a ferroelectric piezoelectric material to which niobium oxide, nickel oxide, magnesium oxide, or the like is added. In greater detail, exemplary materials for the piezoelectric layer 70 include lead titanate $PbTiO_3$, lead zirconate titanate $Pb(Zr, Ti)O_3$, lead zirconate $PbZrO_3$, lead lanthanum titanate $(Pb, La)TiO_3$, lead lanthanum zirconate titanate $(Pb, La)(Zr, Ti)O_3$, and lead magnesium niobate zirconium titanate $Pb(Zr, Ti)(Mg, Nb)O_3$. The thickness of the piezoelectric layer 70 is suppressed to the extent that cracks do not occur therein in manufacturing processes and is set to the extent that sufficient displacement occurs. For example, according to the invention, the thickness of the piezoelectric layer 70 is around 1 to 2 µm.

Lead electrodes 90 made of, for example, gold Au are connected to the upper electrode film 80 serving as the individual electrodes of the piezoelectric elements 300, in which each lead electrode 90 extends from around an end portion of the corresponding individual electrode which is near the ink supply channel 14 to a midway position on the insulation film 55.

A protective substrate 30 having a reservoir portion 31 constituting at least part of a reservoir 100 is joined with the fluid channel forming substrate 10 on which the piezoelectric elements 300 are formed using an adhesive 35. That is, the protective substrate 30 is disposed on the lower electrode film 60, the elastic film 50 and the lead electrodes 90. The reservoir portion 31 is structured so as to continuously extend in the width direction of the pressure generating chamber 12 and to penetrate through the protective substrate 30 in the thickness direction. As described above, the reservoir portion 31 is structured to communicate with the communication portion 13 formed in the fluid channel forming substrate 10, thereby constituting the reservoir 100 serving as a shared ink chamber shared by all of the pressure generating chambers 12.

The protective substrate 30 has a piezoelectric element maintaining portion 32 having a space in which motions of the piezoelectric element 300 are not hindered at a region thereof, which faces the piezoelectric element 300 of the protective substrate 30. The space of the piezoelectric element maintaining portion 32 has a sufficient size not to hinder the motions of the piezoelectric element 300. The space may be sealed or alternatively may not be sealed.

The protective substrate 30 is preferably made of a material having a thermal expansion coefficient which is almost the same as that of the fluid channel forming substrate 10. In this embodiment, the fluid channel forming substrate 10 and the protective substrate 30 are made of the same material, for example, a single crystal silicon substrate.

A penetration channel 33 is formed in the protective substrate 30 so as to penetrate through the protective substrate 30 in the thickness direction. One end portion of each of the lead electrodes 90 extending from the corresponding piezoelectric elements 300 is visible inside the penetration channel 33.

A driver circuit 200 which drives the piezoelectric elements 300 arranged in parallel to each other is fixed onto the protective substrate 30. The driver circuit 200 may be realized in a circuit substrate or a semiconductor integrated circuit (IC). The driver circuit 200 and the lead electrodes 90 are electrically connected to each other by connection wirings 210 made of a conductive wire, such as a bonding wire.

A compliance substrate 40 composed of a sealing film 41 and a fixing plate 42 is joined onto the protective substrate 30. The sealing film 41 is made of a material having flexibility and low rigidity. That is, the sealing film 41 is formed of, for example, a polyphenylene sulfide (PPS) film and has a thickness of 6 µm. The sealing film 41 closes one open end (upper end in figures) of the reservoir portion 31. The fixing plate 42 is made of a rigid material, such as, metal. That is, the fixing plate 42 is made of, for example, stainless steel (SUS) and has a thickness of 30 µm. The fixing plate 42 has an opening 43, which penetrates through the fixing plate 42 in the thickness direction, at a region corresponding to the reservoir 100. Accordingly, the one end of the reservoir 100 is sealed only by the sealing film 41 having flexibility.

An ink injection hole 44 through which ink is supplied to the reservoir 100 is formed in the compliance substrate 40 on an outer side of the reservoir 100 at a midway position of the reservoir 100 in the lengthwise direction. On the other hand, the protective substrate 30 further includes an ink guide channel communicating with the ink injection hole and a side wall of the reservoir 100.

Figure 3:
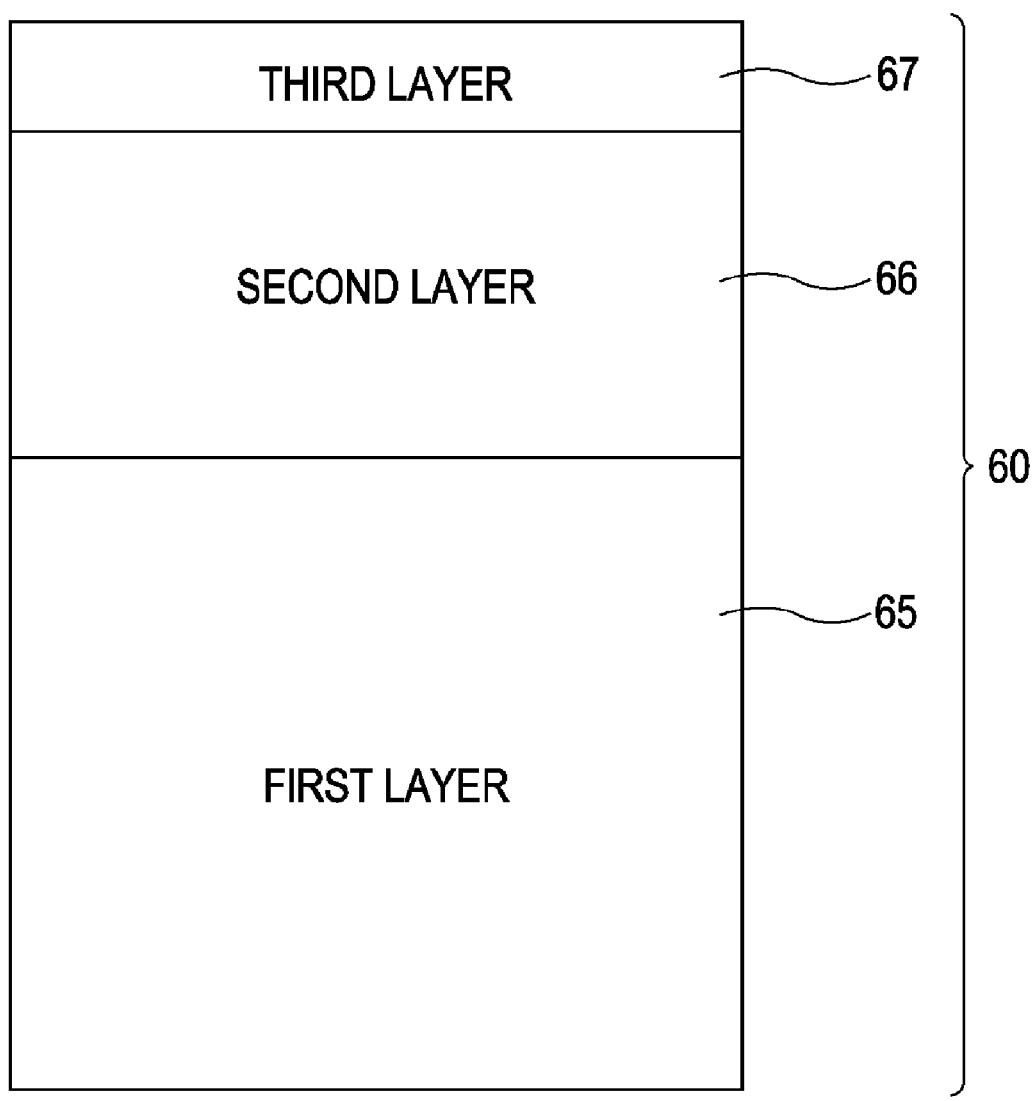
FIG. 3 is a sectional view illustrating a lower electrode film according to the first embodiment.
Figure 4:
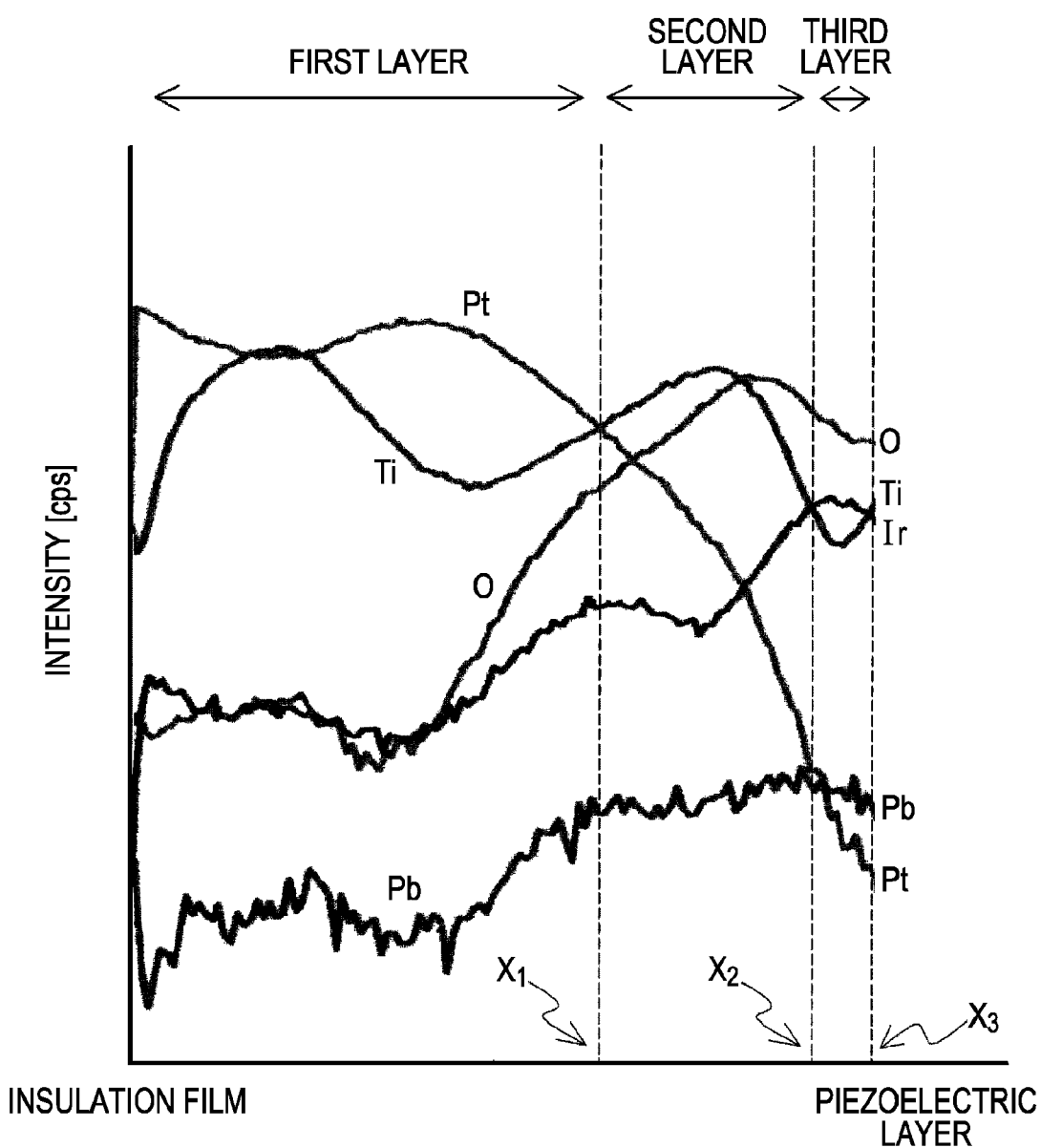
FIG. 4 is a graph illustrating a ratio of elements contained in the lower electrode film according to the first embodiment.

Hereinafter, the lower electrode film 60 will be described in greater detail with reference to FIGS. 3 and 4. FIG. 3 shows the lower electrode film according to this embodiment in a sectional view. FIG. 4 is a graph illustrating intensities of elements (expressed in units of cps) in the thickness direction in the lower electrode film 60. The graph shown in FIG. 4 is obtained on the basis of analysis of the lower electrode film 60, using a Secondary Ion Mass Spectrometer (SIMS).

As shown in FIG. 3, the lower electrode film 60 according to this embodiment is composed of three layers (a first layer, a second layer, and a third layer) containing different components, respectively as a primary component, in which the layers are arranged in a continuous manner. As shown in FIG. 4, X1, X2 and X3 indicate positions where the primary components are changed from one component to another. In FIG. 4, a portion from the surface of the lower electrode film 60, which is near the insulation film 55, to the position X1 constitutes the first layer 65, a portion from the position X1 to the position X2 constitutes the second layer 66, and a portion from the position X2 to the position X3 constitutes the third layer 67. Accordingly, the first layer 65 containing platinum Pt as a primary component is disposed on the insulation layer 55, the second layer 66 containing titanium Ti as a primary component is disposed on the first layer 65, and the third layer 67 containing iridium Ir as a primary component is disposed on the second layer 66. The primary component means a metal element having the highest intensity among elements detected in each layer 65 to 67. The primary component contained in each layer doest not exist in a predetermined form, but can exist in any form, such as a form of singular molecules, a form of an alloy, a form of a metal compound, or other chemically available forms. The second layer 66 is interposed between the first layer 65 and the third layer 67 as an adhesion layer in order to secure adhesion between the first layer 65 and the third layer 67 and also to improve adhesion between the first and third layers 65 and 67 and their respective upper or lower layers by acting as a titanium source which allows the first and third layers 65 and 67 to contain titanium as a secondary component. That is, it becomes that a lot of metal elements having a strong adhesion property are distributed in every layer including the first layer 65 to the third layer 67. By such a design of the lower electrode film 60, it is possible to enhance adhesion both between the lower electrode film 60 and a substrate (fluid channel forming substrate 10) and between the lower electrode film 60 and the piezoelectric layer 70. Moreover it is possible to improve the displacement characteristic and enhance long-term reliability of the lower electrode film 60.

The thickness ratio of the first to third layers 65, 66, and 67 is not particularly limited but it may be 6 to 7:3 to 2:1. However, it is preferable that the ratio of the sum of the thicknesses of the first layer 65 and the second layer 66 to the thickness of the third layer 67 may be 9:1. By setting the thicknesses of the first to third layers to be in the above-mentioned ratio, it is possible to enhance adhesion both between the lower electrode film 60 and the substrate (fluid channel forming substrate 10) and between the lower electrode film 60 and the piezoelectric layer 70. Moreover it is possible to improve the displacement characteristic and enhance long-term reliability.

The secondary component (a metal element having the second highest intensity among elements detected in each layer) is not limited to a particular element, but it is preferable that the secondary components for the first layer 65, the second layer 66, and the third layer 67 are titanium Ti, platinum Pt, and titanium Ti, respectively. By such setting of the secondary components for the first layer, the second layer, and the third layer, it is possible to enhance adhesion both between the lower electrode film 60 and the substrate (fluid channel forming substrate 10) and between the lower electrode film 60 and the piezoelectric layer 70. Moreover it is possible to improve the displacement characteristic and enhance long-term reliability of the lower electrode film 60.

The first layer 65, the second layer 66, and the third layer 67 may contain lead Pb but by a small amount. In greater detail, if a large amount of lead Pb which thermally diffused from the piezoelectric precursor contacts the substrate before calcining the piezoelectric layer 70, which will be described below, the surface of the substrate becomes deteriorated. As a result, the piezoelectric elements 300 are separated from the substrate. Accordingly, by the design of the third layer 67 in which iridium is a primary component, it is possible to prevent lead from diffusing to the substrate from the piezoelectric precursor film, and thus it is possible to prevent the piezoelectric elements from being separated from the substrate.

A method for manufacturing the lower electrode film 60 is not limited to any technique. However, it is preferable that the lower electrode film 60 may be manufactured by a method including a step of sequentially stacking an adhesion layer containing titanium Ti as a primary component, a platinum layer containing platinum as a primary component, and a diffusion barrier layer containing iridium as a primary component on the insulation layer 55 so as to have thicknesses in the ratio of 1:4 to 6:0.5 to 1, and a step of performing heat treatment with respect to the stacked structure including the adhesion layer, the platinum layer, and the diffusion barrier layer. The heat treatment with respect to the adhesion layer, the platinum layer, and the diffusion barrier layer may be performed in the state in which these layers are sequentially stacked on the insulation layer 55, or in the state in which a piezoelectric precursor film is formed on the diffusion barrier layer. In the case of forming the lower electrode film by performing the heat treatment after formation of the piezoelectric precursor film, it is possible to form the lower electrode film 60 and the piezoelectric layer 70 by a single cycle of heat treatment. Accordingly, a manufacturing method can be simplified, resulting in reduction of manufacturing cost. Even in the case in which a seed titanium layer is disposed between the diffusion barrier layer and the piezoelectric precursor film, it is possible to manufacture the lower electrode film by the same manufacturing method.

In this embodiment, the piezoelectric layer 70 and the lower electrode film 60 are formed by performing the heat treatment in the state in which all of the adhesion layer, the platinum layer, the diffusion barrier layer, and the piezoelectric precursor film are sequentially stacked.

In the ink jet recording head according to this embodiment, ink is introduced through the ink injection hole 44 connected to an external ink supply unit (not shown) and then a fluid passage from the reservoir 100 to the nozzle orifice 21 is filled with the ink.

At this time, if a voltage is applied across the lower electrode film 60 and the upper electrode film 80 disposed correspondingly to the pressure generating chamber 12 in response to a recording signal output from the driver circuit 200, the elastic layer 50, the lower electrode film 60 and the piezoelectric layer 70 cause flexural deformations. Thus, the pressure in each pressure generating chamber 12 increases, and thus ink drops are ejected from the nozzle orifice 21.

Figure 5A:
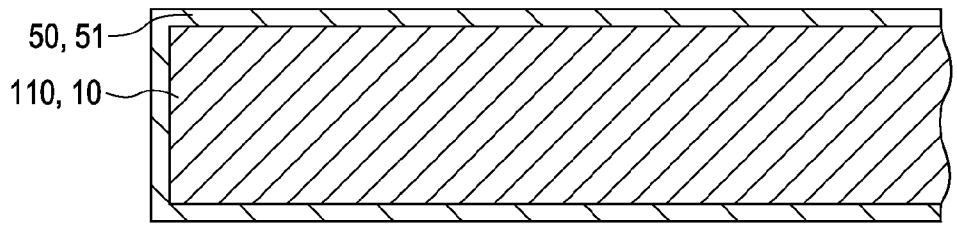
FIGS. 5A to 5D are sectional views illustrating process steps of a method of manufacturing the recording head according to the first embodiment.

Hereinafter, a method of manufacturing the ink jet recording head will be described with reference to FIGS. 5A to 5D, 6A to 6D, 7A to 7C, 8A to 8C, and 9. FIGS. 5A to 5D, 6A to 6D, 7A to 7C, 8A to 8C, and 9 are sectional views in the long-size direction illustrating a pressure generating chamber. First, as shown in FIG. 5A, a silicon wafer 110 to be the fluid channel forming substrates (hereinafter, referred to as "fluid channel forming substrate wafer 110) is thermally oxidized at a temperature of 1100° C., thereby forming a silicon dioxide film 51 constituting the elastic layer 50 on the surface of the silicon wafer 100. In this embodiment, a silicon wafer which has relatively high rigidity and is relatively thick by having a thickness of 625 μm is used as the fluid channel forming substrate wafer 110.

Figure 5B:
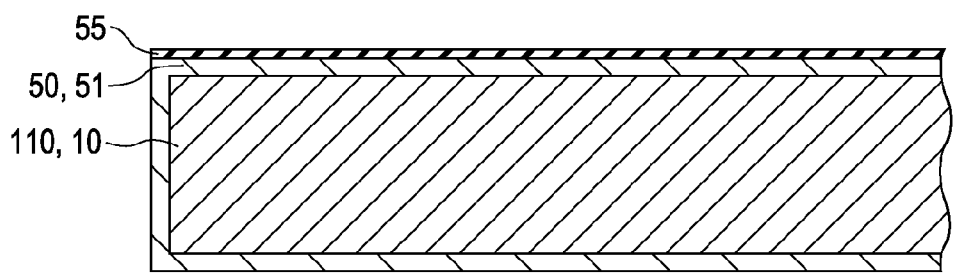

Next, as shown in FIG. 5B, an insulation film 55 made of zirconium oxide is formed on the elastic film 50 (silicon dioxide film 51). In greater detail, a zirconium Zr layer is formed on the elastic film 50 (silicon dioxide film 51), for example, by a sputtering method, and then the zirconium layer is thermally oxidized in a diffusion furnace at a temperature in the range from 500 to 1200° C. As a result, the insulation film 55 made of zirconium oxide $ZrO_2$ is formed.

Figure 5C:
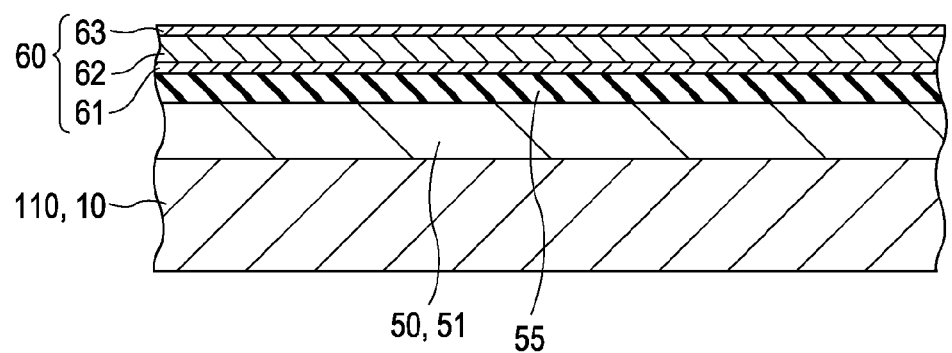

Next, as shown in FIG. 5C, the lower electrode film 60 composed of the adhesion layer 61, the platinum layer 62, and the diffusion barrier layer 63 is formed. In greater detail, first, the adhesion layer 61 is formed on the insulation film 55. The adhesion layer 61 may have a thickness in the range from 20 to 40 nm and contain titanium Ti as a primary component. In this embodiment, the adhesion layer 61 is a titanium layer having a thickness of 20 nm. As described above, by setting the adhesion layer 61 as the lowermost layer of the lower electrode film 60, it is possible to increase adhesion between the insulation film 55 and the lower electrode film 60. Next, the platinum layer 62 having a thickness in the range from 120 to 130 nm and made of platinum Pt is formed on the adhesion layer 61. In this embodiment, the platinum layer 62 has a thickness of 130 nm. Next, the diffusion barrier layer 63 is formed on the platinum layer 62. Thus, formation of the lower electrode film composed of the adhesion layer 61, the platinum layer 62, and the diffusion barrier layer 63 is completed. The diffusion barrier layer 63 is provided in order to prevent components in the adhesion layer from diffusing into a piezoelectric layer 70 and to prevent components in the piezoelectric layer 70 diffusing into the lower electrode film 60 when the piezoelectric layer 70 is calcined so as to be crystallized. The diffusion barrier layer 63 may have a thickness in the range from 5 to 20 nm and contains iridium Ir as a primary component. In this embodiment, the diffusion barrier layer 63 is an iridium layer having a thickness of 10 nm. According to this embodiment, the adhesion layer 61, the platinum layer 62, and the diffusion barrier layer 63 having thicknesses in the ratio of 1:6:1 is formed on the insulation layer 55.

Figure 5D:
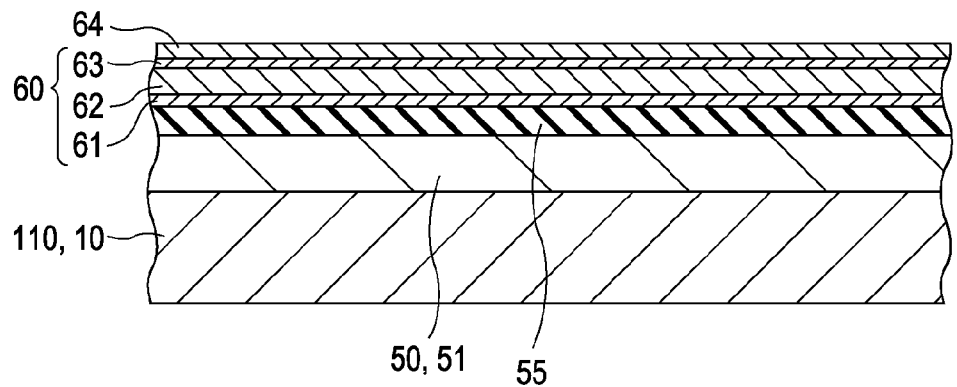

Next, as shown in FIG. 5D, a seed titanium layer 64 made of titanium Ti is formed on the lower electrode film 60. The seed titanium layer 64 has a thickness in the range from 3.5 to 5.5 nm. Further, it is preferable that the seed titanium layer 64 is 4.0 nm thick. In this embodiment, the seed titanium layer 64 is 4 nm thick.

Here, the seed titanium layer 64 act as seeds for promoting crystallization upon crystallizing the piezoelectric layer 70, and also functions as a titanium source for supplying titanium elements to the piezoelectric layer 70, so that titanium exists in the piezoelectric layer 70 after calcining.

The layers 61 to 63 of the lower electrode film 60 and the seed titanium layer 64 can be formed, for example, by a DC magnetron sputtering method.

Next, the piezoelectric layer 70 made of PZT is formed. In this embodiment, the piezoelectric layer 70 is formed using a sol-gel method in which a sol in which metal organic substance is dissolved and dispersed in catalyst is prepared, the sol is coated on a surface and dried so as to produce a gel film, and the gel film is calcined at a high temperature so as to form the piezoelectric layer 70 made of a metal oxide. A material for the piezoelectric layer 70 is not limited to lead titanate zirconate. That is, other piezoelectric materials, for example, a relaxor ferroelectric substance, such as PMN-PT, PZN-PT, PNN-PT, and the like may be used. The manufacturing method of the piezoelectric layer 70 is not limited to the sol-gel method. That is, a metal-organic decomposition (MOD) method or a sputtering may be used.

Figure 6A:
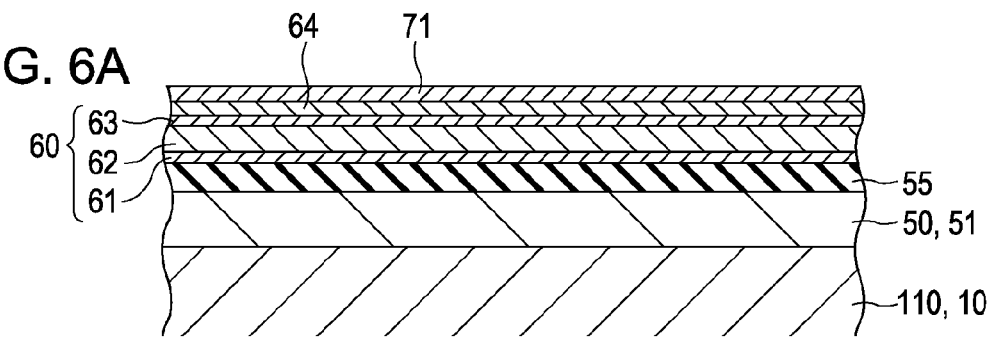
FIGS. 6A to 6D are sectional views illustrating process steps of a method of manufacturing the recording head according to the first embodiment.

Hereinafter, detailed steps of a sequence of forming the piezoelectric layer 70 will be described. AS shown in FIG. 6A, a PZT precursor film 71 which is an example of the piezoelectric precursor film is formed on the seed titanium layer 64 disposed on the lower electrode film 60. That is, a sol (solution) containing a metal organic compound is coated on the fluid channel forming substrate wafer 110 (coating process). Next, the piezoelectric precursor film 71 is heated to a predetermined temperature and dried for a predetermined period (drying process). For example, in this embodiment, the piezoelectric precursor film 71 is dried by maintaining the piezoelectric precursor film 71 at a temperature in the range from 170 to 180° C. for 8 to 30 minutes.

Next, the dried piezoelectric precursor film 71 is heated to and maintained at a predetermined temperature for the purpose of degreasing (degreasing process). For example, in this embodiment, the degreasing process is performed by heating the piezoelectric precursor film 71 at a temperature in the range from 300 to 400° C. for 10 to 30 minutes. The word "degreasing" means to separate organic substance contained in the piezoelectric precursor film 71 in the form of $NO_2$, $CO_2$, $H_2O$, or the like.

Figure 6B:
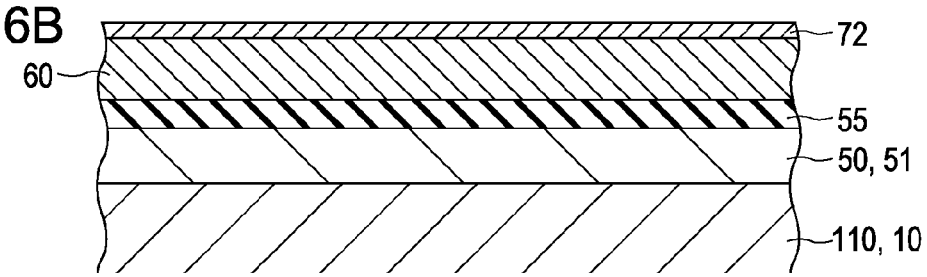

Next, as shown in FIG. 6B, the piezoelectric precursor film 71 is crystallized by being disposed at a predetermined temperature for a predetermined period so as to become the piezoelectric layer 72 (calcining process). In the calcining process, it is preferable that the piezoelectric precursor film 71 is heated at a temperature in the range from 550 to 800° C. In this embodiment, the piezoelectric layer 72 is formed by calcining the piezoelectric precursor film 71 at a temperature 680° C. for 5 to 30 minutes. Here, a heating method for the calcining process is not particularly limited, but may be a rapid thermal annealing (RTA) method. That is, it is preferable that the piezoelectric precursor film 71 is rapidly heated. In this embodiment, a rapid thermal processing (RTP) device which heats objects by irradiation of ultraviolet rays from an ultraviolet ray lamp is used, so that the piezoelectric film is heated at a relatively high heating rate. At this time, the lower electrode film 60 is also heated. Accordingly, titanium elements in the seed titanium layer 64 diffuse to the piezoelectric layer 70, so that the lower electrode film 60 having a three-layered structure comes to be formed. That is, it is possible to form the lower electrode film 60 containing platinum Pt, titanium Ti, iridium Ir, and oxygen O and including the first layer 65 which contains platinum Pt as a primary component, the second layer 66 which contains titanium Ti as a primary component, and the third layer 67 which contains iridium Ir as a primary component. According to the above-mentioned manufacturing method, since the lower electrode film 60 and the piezoelectric layer 70 can be formed by a single cycle of heat treatment, it is possible to simplify the manufacturing method and thus it is possible to reduce manufacturing cost.

The heating device used in the drying process and degreasing process can be a hot plate, an RTP, or the like.

Figure 6C:
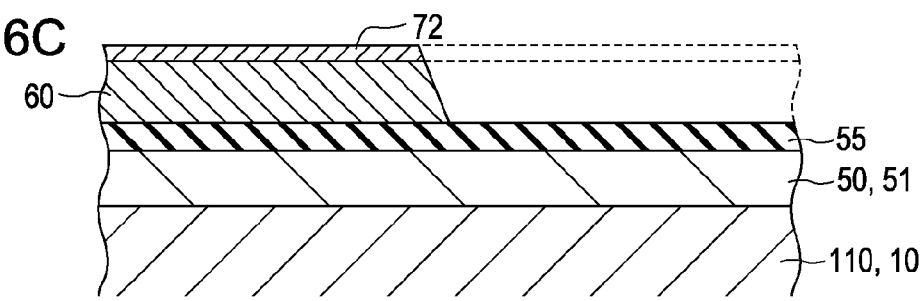

As shown in FIG. 6C, in a step of forming a first layer of the piezoelectric film 72 on the lower electrode film 60, the lower electrode film 60 and the first layer of the piezoelectric film 72 are patterned so as to have inclined side surfaces.

At this time, in the case of forming the first layer of the piezoelectric film 72 after forming and patterning the seed titanium layer 64 on the lower electrode film 60, a property of the seed titanium layer 64 is altered since the lower electrode film 60 is patterned by performing a photolithography process, an ion milling process, and an ashing process. Thus, the crystalline characteristic of the piezoelectric film 72 is not good because the first layer of the piezoelectric film 72 is formed on the altered seed titanium layer 64. Further, since other layers of the piezoelectric film 72 are formed on the first layer of the piezoelectric film 72 by a crystal growth method while being influenced by the crystalline characteristic of the first layer of the piezoelectric film 72, it is impossible to form the piezoelectric layer 72 having the good crystalline characteristic.

On the other hand, in the case in which the lower electrode film 60 and the first layer of the piezoelectric film 72 are simultaneously patterned after the first layer of the piezoelectric film 72 is formed, the first layer of the piezoelectric film 72 can function better seeds on which crystals of the second and further layers of the piezoelectric film 72 are grown than the seed titanium layer 64. Further, the first layer of the piezoelectric film 72 negligeably affects the crystal growth of the second and further layers of the piezoelectric film 72 even in the case in which the first layer of the piezoelectric film 72 has an altered layer having a very slight thickness on the surface thereof.

Figure 6D:
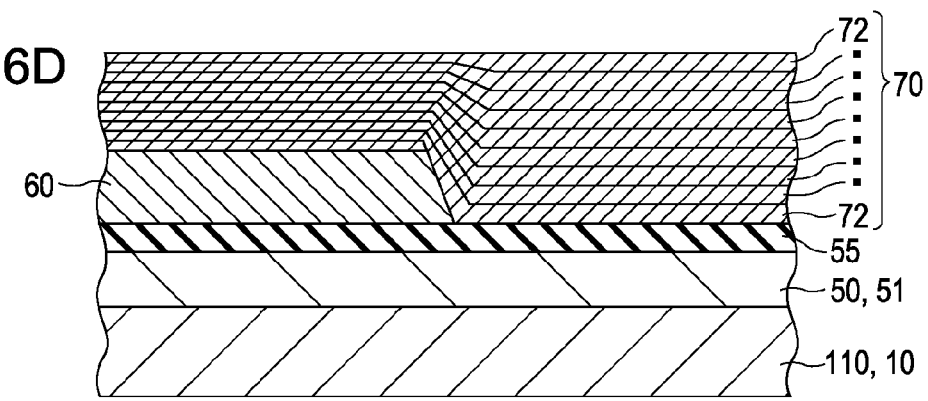

Accordingly, as shown in FIG. 6D, the piezoelectric layer 70 having a predetermined thickness and formed of the piezoelectric film composed of a plurality of layers is formed by repeating the above-mentioned piezoelectric film forming sequence including the coating process, the drying process, and the degreasing several times. For example, if a single time of sol coating produces a layer of 0.1 µm, the total thickness of the piezoelectric layer 70 formed of the piezoelectric film 72 composed of ten layers becomes about 1.1 µm. Even in the case in which the piezoelectric layer 70 is formed by the above-mentioned method, it is possible to form the lower electrode film 60 containing platinum Pt, titanium Ti, iridium Ir, and oxygen O and including the first layer 65 which contains platinum Pt as a primary component, the second layer 66 which contains titanium Ti as a primary component, and the third layer 67 which contains iridium Ir as a primary component.

As described above, by adopting the method in which the first layer of the piezoelectric film 72 is formed on the lower electrode film 60 and then the first layer of the piezoelectric film 72 and the lower electrode film 60 are simultaneously patterned together so that the lower electrode film 60 and the first layer of the piezoelectric film 72 have inclined side surfaces, it is possible to reduce or alleviate the influence of difference of base layers to the crystalline characteristics of the second layer of the piezoelectric film 72 at the interface between the lower electrode film 60 and the first layer of the piezoelectric film 72 and other layers or films in contact with the lower electrode film 70 and the first layer of the piezoelectric film 70 upon forming the second layer of the piezoelectric film 72. Thus, crystal growth of the second layer of the piezoelectric film 72 can be smoothly achieved at the interface between the lower electrode film 70 and other layers or films, so that it is possible to form the piezoelectric layer 70 having the excellent crystalline characteristic. Moreover, thanks to the inclined side surfaces of the lower electrode film 60 and the first layer of the piezoelectric film 72, it is possible to improve the coating property upon forming the second or further layers of the piezoelectric precursor film 71. Further, it is possible to form the piezoelectric layer 70 having excellent adhesion and enhanced reliability.

Figure 7A:
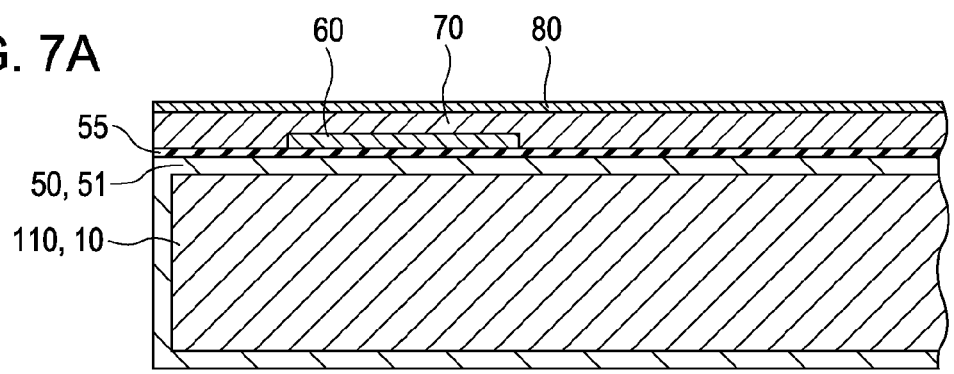
FIGS. 7A to 7C are sectional views illustrating process steps of a method of manufacturing the recording head according to the first embodiment.
Figure 7B:
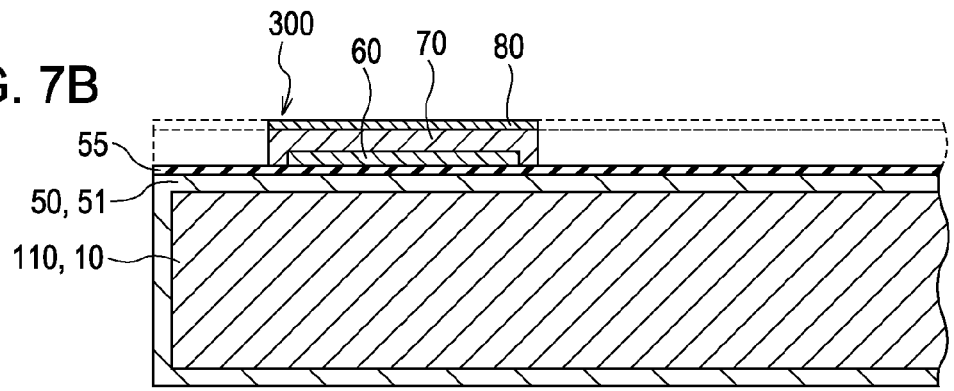

After formation of the piezoelectric layer 70, as shown in FIG. 7A, an upper electrode film 80 made of iridium Ir is formed on the entire surface of the fluid channel forming substrate 10, and then as shown in FIG. 7B, the piezoelectric layer 70 and the upper electrode film 80 are patterned so as to form the piezoelectric elements 300 at regions facing the pressure generating chambers 12.

Figure 7C:
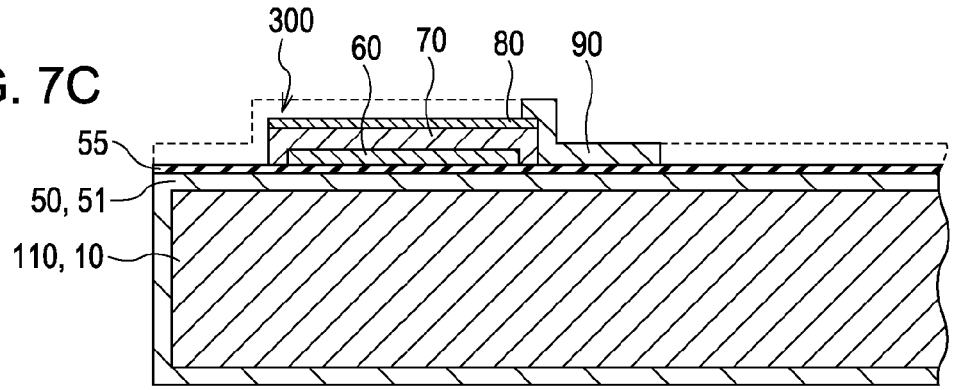

Next, lead electrodes 90 are formed. In greater detail, as shown in FIG. 7C, a lead electrode layer of gold Au is formed on the entire surface of the fluid channel forming substrate 10 and then patterned by using a mask pattern (not shown) made of a resist material, so that the lead electrodes 90 are correspondingly formed to the piezoelectric elements.

Figure 8A:
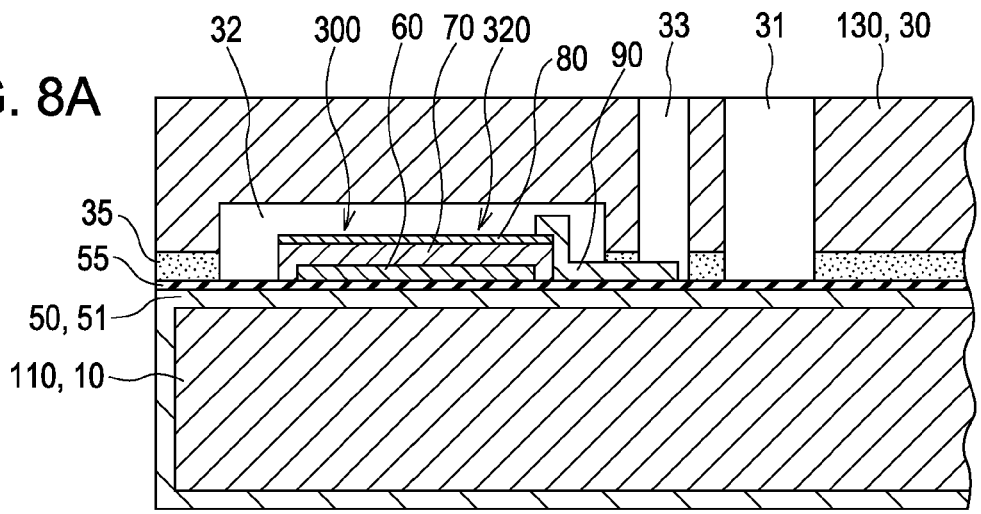
FIGS. 8A to 8C are sectional views illustrating process steps of a method of manufacturing the recording head according to the first embodiment.

Next, as shown in FIG. 8A, a protective wafer 130 used for protective substrates for protecting a plurality of patterned piezoelectric elements 300 is joined onto the surface of the fluid channel forming substrate 10 using an adhesive 35. The protective wafer 130 is provided with a reservoir portion 31 and a piezoelectric element maintaining portion 32 in advance before the protective wafer 130 is attached to the fluid channel forming substrate 10. The protective wafer 130 is a single crystalline substrate having a thickness of 400 µm. After the protective wafer 130 is joined to the fluid channel forming substrate 110, rigidity of the wafer 100 for serving as the fluid channel forming substrate is enhanced.

Figure 8B:
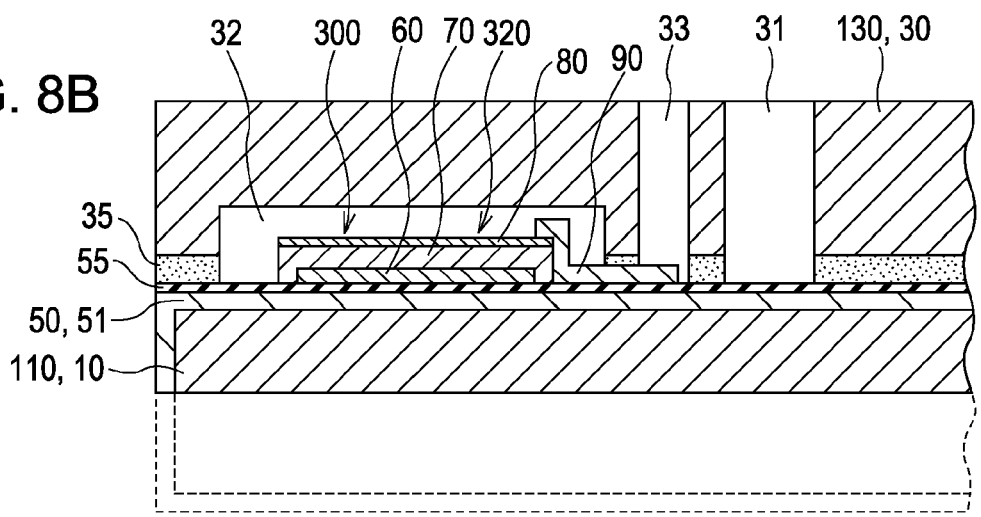

Next, as shown in FIG. 8B, a fluid channel forming substrate wafer 110 used for forming the fluid channel forming substrates is grinded until the fluid channel forming substrate wafer 110 has a predetermined thickness and then it is etched by a wet etching method using fluoro-nitric acid so as to allow the fluid channel forming substrate wafer 110 to have a desirable thickness. For example, according to this embodiment, the fluid channel forming substrate wafer 110 is processed by a grinding process and a wet etching process so as to finally have a thickness of about 70 µm.

Figure 8C:
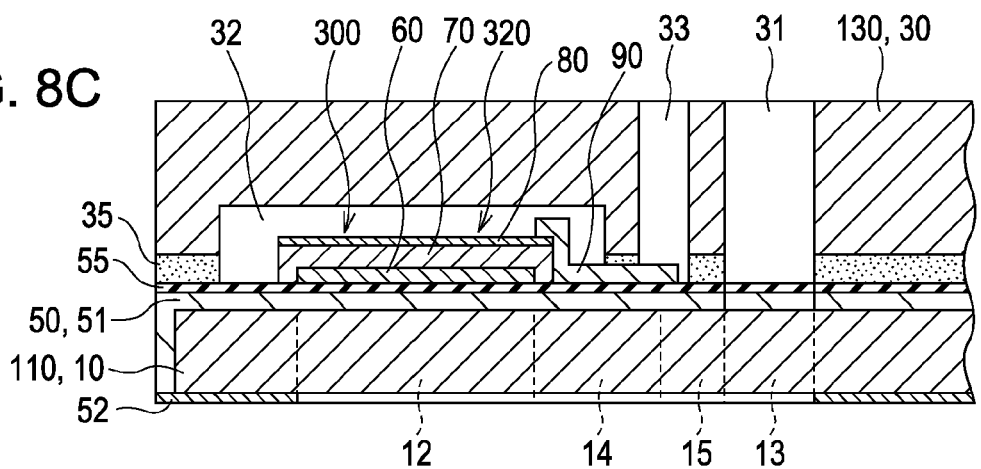
Figure 9:
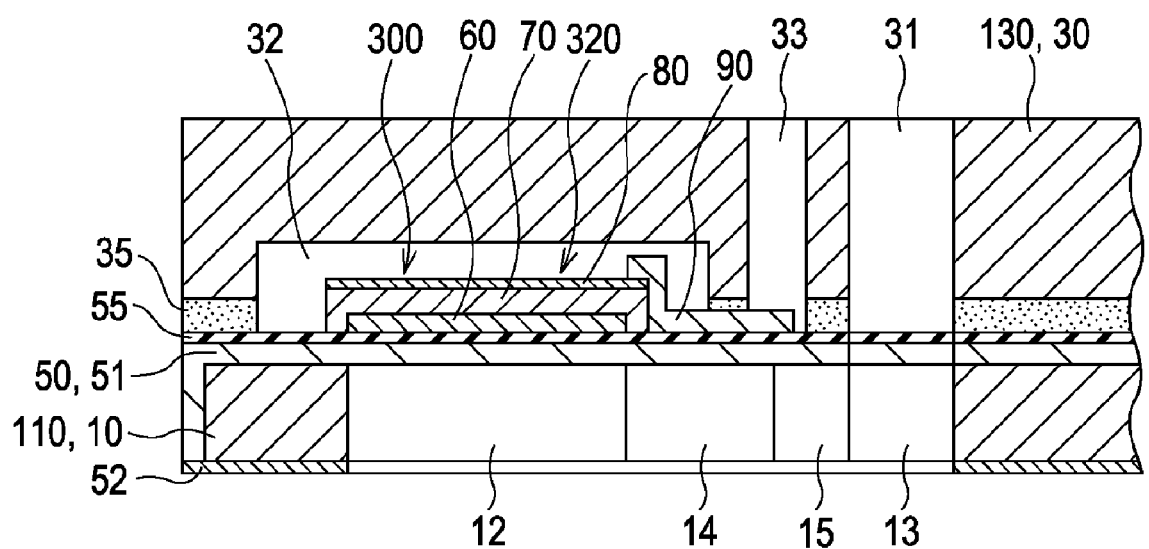
FIG. 9 is a sectional view illustrating a process step of a method of manufacturing the recording head according to the first embodiment.

Next, as shown in FIG. 8C, a mask film 52 made of silicon nitride SiN is formed on the fluid channel forming substrate wafer 110 and then patterned so as to have a predetermined pattern. Next, as shown in FIG. 9, the fluid channel forming substrate wafer 110 is etched in an unisotrophic manner by a wet etching method using an alkali solution, such as KOH in the presence of the mask film 52. As a result, pressure generating chambers 12, communication portions 13, ink supply channels 14 and the communication channels 15 are formed.

Next, the mask film 52 on the fluid channel forming substrate wafer 110, the mask film 52 being disposed on the open end side of the pressure generating chambers 12, is removed, and unnecessary portions provided at peripheral portions of the fluid channel forming substrate wafer 110 and the protective wafer 130 are removed by a cutting method, such as a dicing method. Next, a nozzle plate 20 having nozzle orifices 21 formed penetrating through the nozzle plate 20 is joined to the surface of the fluid wafer forming substrate wafer 110 which is farther from the protective wafer 130. The compliance substrate 40 is joined to the protective wafer 130. After that, the combined structure including the fluid channel forming substrate wafer 110 is divided into a plurality of fluid channel forming substrates 10 in a chip scale as shown in FIG.

1. By this, the ink jet recording head having the above-mentioned structure is manufactured.

According to the above-mentioned manufacturing method, it is possible to form the first layer 65 containing platinum as a primary component, the second layer 66 containing titanium as a primary component, and the third layer 67 containing iridium as a primary component on the insulation film 55, and thus it is possible to produce the piezoelectric element 300 and the ink jet recording head which have excellent adhesion, displacement characteristic and long-term reliability. Further, by setting the thickness ratio of the first layer 65, the second layer 66, and the third layer 67 to be 6 to 7:3 to 2:1, it is possible to produce the piezoelectric element 300 and the ink jet recording head which have excellent adhesion, displacement characteristic and long-term reliability. Moreover, by designing the first layer 65, the second layer 66, and the third layer 67 to contain titanium, platinum, and titanium, respectively as a secondary component, it is possible to produce the piezoelectric element 300 and the ink jet recording head which have excellent adhesion, displacement characteristic and long-term reliability.

Second Embodiment

Hereinabove, the first embodiment of the invention is described. However, the basic structure of the ink jet recording head is not limited to the structure as in the first embodiment. For example, the first embodiment provides the method in which the piezoelectric film 72 is formed by calcining the piezoelectric precursor film 71 after forming the piezoelectric precursor film 71 by the coating, drying, and degreasing processes. However, the invention is not limited thereto. That is, the piezoelectric film 72 may be formed by calcining the piezoelectric precursor film 71 after forming the piezoelectric precursor film 71 by repeatedly performing the sequence including the coating, drying, and degreasing processes several times, for example, two times. In any cases, it is possible to form the lower electrode film 60 which finally containing platinum Pt, the titanium Ti, iridium Ir, and oxygen O and including the first layer 65 containing platinum as a primary component, the second layer 66 containing titanium as a primary component, and the third layer 67 as a primary component.

In the first embodiment, the piezoelectric layer 70 is formed by a sol-gel method, but the invention is not limited thereto. For example, the piezoelectric layer 70 may be formed by a sputtering method or a hydrothermal method. In the case of forming the piezoelectric layer 70 by a sputtering method, the piezoelectric layer 70 may be formed at the time after the adhesion layer 61, the platinum layer 62, and the diffusion barrier layer 63 are formed on the insulation film 55, and then these layers 61 to 63 are heated.

The ink jet recording head is exemplified as the liquid ejecting head in the first embodiment, but the invention can be applied to the overall kinds of liquid ejecting heads. That is, the invention can be also applied to methods of manufacturing liquid ejecting heads which eject liquid droplets as well as ink droplets. Examples of the liquid ejecting head include a variety of kinds of recording head, a color material ejection head used to manufacture a color filter of a liquid crystal display, an electrode material ejection head used to form electrodes of a field emission display (FED), a living organic material ejection head used to manufacture a biochip, or the like.

The invention is not limited to the manufacturing method of the piezoelectric element mounted a liquid ejecting head represented by an ink jet recording head but can be applied to a method of manufacturing a piezoelectric element mounted on other devices.

What is claimed is:

1. A piezoelectric element, comprising:
   a first electrode film formed on one surface of a substrate;
   a piezoelectric layer made of a piezoelectric material and disposed on the first electrode film; and
   an second electrode film disposed on the piezoelectric layer,
   wherein the first electrode film contains platinum, titanium, iridium, and oxygen, and
   wherein the first electrode film includes a first layer disposed on the substrate and containing platinum as a primary component, a second layer disposed on the first layer and containing titanium as a primary component, and a third layer disposed on the second layer and containing iridium as a primary component.

2. The piezoelectric element according to claim 1, wherein the first layer, the second layer, and the third layer contain titanium, platinum, and titanium, respectively, as a secondary component.

3. The piezoelectric element according to claim 1, wherein a thickness ratio of the first layer, the second layer, and the third layer is 6 to 7:3 to 2:1.

4. A liquid ejecting head comprising:
   the piezoelectric element according to claim 1; and
   a fluid channel forming substrate, on a side of which the piezoelectric element is disposed with a vibrating plate interposed between the fluid channel forming substrate and the piezoelectric element and which has a pressure generating chamber communicating with a nozzle orifice from which liquid droplets are ejected.

5. A method of manufacturing a piezoelectric element, comprising:
   forming a first electrode film by sequentially stacking an adhesion layer made of titanium, a platinum layer made of platinum, and a diffusion barrier layer made of iridium where a thickness ratio of the adhesion layer, the platinum layer, and the diffusion barrier layer is 1:4 to 6:0.5 to 1;
   forming a piezoelectric precursor film made of a piezoelectric material on the first electrode film while forming a piezoelectric layer formed of a piezoelectric film which is obtained by crystallizing the piezoelectric precursor film by a calcining process; and
   forming an second electrode film on the piezoelectric layer.

* * * * *